United States Patent
Fabrie et al.

(10) Patent No.: US 10,819,331 B1
(45) Date of Patent: Oct. 27, 2020

(54) SELF-REGULATING BODY-BIASING TECHNIQUES FOR PROCESS, VOLTAGE, AND TEMPERATURE (PVT) FLUCTUATION COMPENSATION IN FULLY-DEPLETED SILICON-ON-INSULATOR (FDSOI) SEMICONDUCTORS

(71) Applicant: NXP B.V., Eindhoven (NL)

(72) Inventors: Sebastien Antonius Josephus Fabrie, Eindhoven (NL); Maarten Vertregt, Eindhoven (NL); Ajay Kapoor, Eindhoven (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/404,931

(22) Filed: May 7, 2019

(51) Int. Cl.
| | | |
|---|---|---|
| *H03K 17/687* | (2006.01) | |
| *H03K 17/14* | (2006.01) | |
| *H03K 17/16* | (2006.01) | |

(52) U.S. Cl.
CPC ......... *H03K 17/145* (2013.01); *H03K 17/162* (2013.01)

(58) Field of Classification Search
CPC ....... H01L 2924/00; H01L 2224/32225; H01L 2224/48227; H01L 2224/73265; H03K 17/223; H03K 17/145; H03K 17/687
See application file for complete search history.

(56) References Cited

U.S. PATENT DOCUMENTS

| | | | | |
|---|---|---|---|---|
| 5,486,788 A | * | 1/1996 | Schlager | H03F 1/303 330/51 |
| 7,649,402 B1 | | 1/2010 | Chen | |
| 9,837,439 B1 | * | 12/2017 | Faul | H01L 23/50 |
| 2008/0024105 A1 | * | 1/2008 | Wang | G05F 3/262 323/315 |
| 2015/0280716 A1 | * | 10/2015 | Vashishtha | H03K 19/09487 327/312 |

OTHER PUBLICATIONS

Tschanz, et al., "Adaptive Body Bias for Reducing Impacts of Die-to-Die and Within-Die Parameter Variations on Microprocessor Frequency and Leakage," IEEE Journal of Solid-State Circuits, Nov. 2002, pp. 1396-1402, vol. 37, No. 11, publisher IEEE.
Bipul, et al., "An 8×8 Sub-Threshold Digital CMOS Carry Save Array Multiplier," Proceedings of the 27th European Solid-State Circuits Conference, Sep. 18-20, 200, 4 pages, publisher IEEE.

* cited by examiner

*Primary Examiner* — Sibin Chen

(57) ABSTRACT

Self-regulating body-biasing techniques for Process, Voltage, and Temperature (PVT) fluctuation compensation in Fully-Depleted Silicon-on-Insulator (FDSOI) semiconductors are disclosed. In an illustrative, non-limiting embodiment, an electronic device may include a logic cell having a plurality of FDSOI transistors manufactured thereon; and at least one current source coupled to a body terminal of each transistor in a subset of the FDSOI transistors, wherein the current source is configured to output a high-impedance current.

20 Claims, 5 Drawing Sheets

SELF-REGULATING BODY-BIASING TECHNIQUES FOR PROCESS, VOLTAGE, AND TEMPERATURE (PVT) FLUCTUATION COMPENSATION IN FULLY-DEPLETED SILICON-ON-INSULATOR (FDSOI) SEMICONDUCTORS

FIELD

This disclosure relates generally to semiconductors, and more specifically, to self-regulating body-biasing techniques for Process, Voltage, and Temperature (PVT) fluctuation compensation in Fully-Depleted Silicon-on-Insulator (FDSOI) semiconductors.

BACKGROUND

The emergence of modern technologies, such as the Internet-of-Things (IoT), has created a need for devices that can operate for very long periods of time on a single battery charge. Despite many design advances (e.g., voltage scaling, power gating, clock gating, etc.), conventional semiconductors are not well-suited to meet today's low-power demands.

Sub-threshold (or "near" sub-threshold) semiconductors consume less power than conventional semiconductors, albeit with performance trade-offs. An example of sub-threshold technology is the Fully-Depleted Silicon-on-Insulator (FDSOI) semiconductor.

FDSOI semiconductors have an ultra-thin layer of insulator, referred to as a "buried oxide," disposed over its base silicon. In an FDSOI transistor, a very thin silicon film forms the transistor's channel. Due to the thin nature of the film, there is no need to dope the channel, and the resulting transistor is fully depleted.

Unfortunately, sub-threshold semiconductors are particularly sensitive to Process, Voltage, and Temperature (PVT) variations. To address this problem, the inventors hereof have developed self-regulating body-biasing techniques that compensate for PVT fluctuations.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Self-regulating body-biasing techniques for Process, Voltage, and Temperature (PVT) fluctuation compensation in Fully-Depleted Silicon-on-Insulator (FDSOI) semiconductors are disclosed. New sub-threshold semiconductor technologies such as 28 nm FDSOI provide the capability to tune transistors using body-biasing as an effective knob, which can significantly increase the performance of Integrated Circuits (ICs). With reduced feature sizes, however, the sensitivity of transistors and other devices to fluctuations in Process, Voltage and Temperature (PVT) becomes more evident.

Substrate biasing, also known as body-biasing, is the use of forward and reverse bias techniques to dynamically compensate for PVT fluctuations. Conventionally, body-biasing is applied by asserting a voltage on the body (or back-bias) terminal of a transistor with respect to its source terminal.

Figure 1:
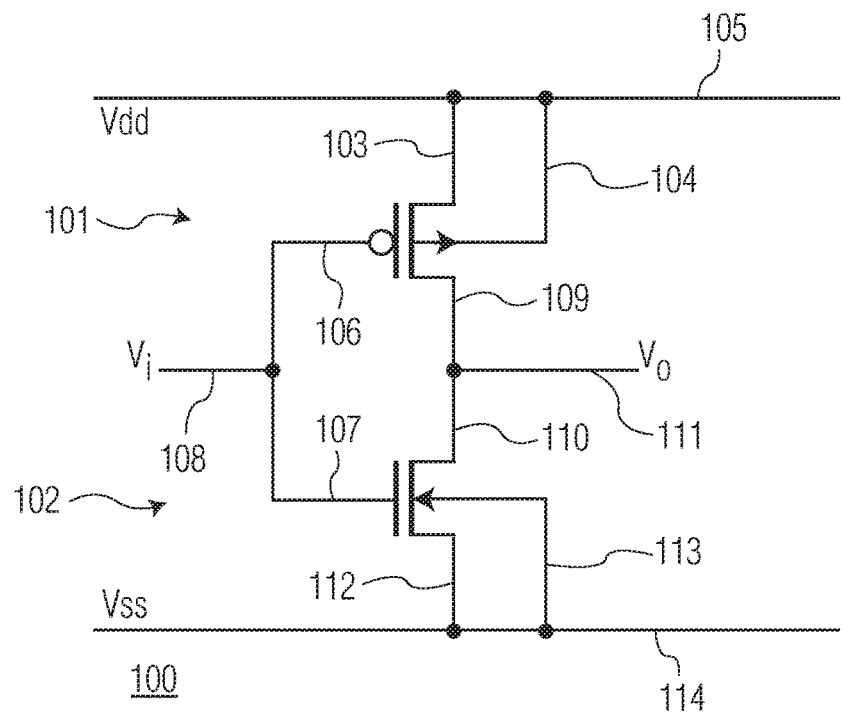
FIG. 1 is a diagram of a conventional Complementary Metal-Oxide Semiconductor (CMOS) device without substrate biasing.
Figure 2:
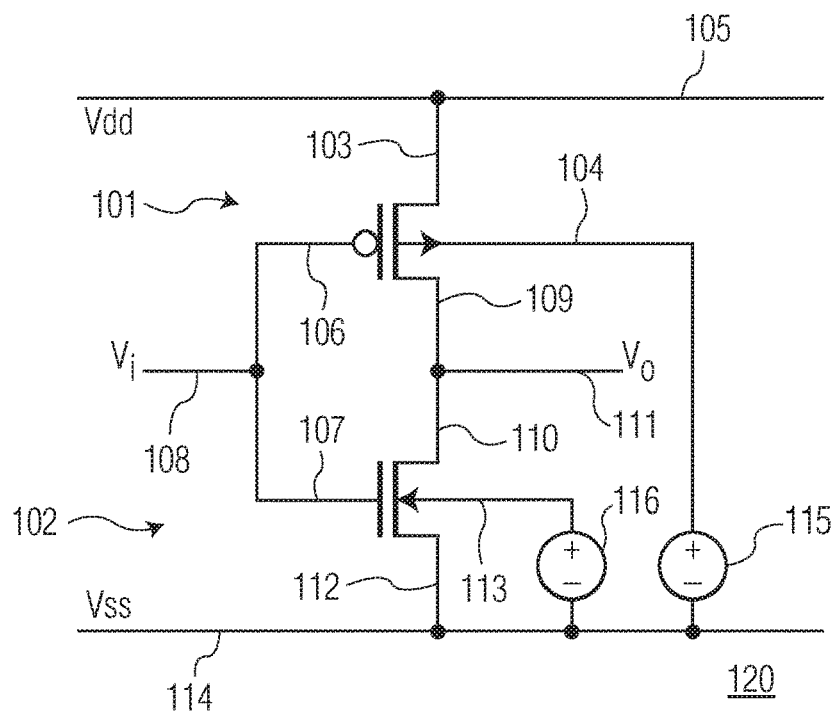
FIG. 2 is a diagram of a conventional CMOS device with substrate biasing.

To illustrate the conventional approach, FIG. 1 shows a Complementary Metal-Oxide Semiconductor (CMOS) device (e.g., 40 nm and above) without body-biasing, and FIG. 2 shows the same device with biasing. In FIG. 1, P-type Metal-Oxide-Semiconductor Field-Effect (PMOS) transistor 101 and N-type Metal-Oxide-Semiconductor Field-Effect (NMOS) transistor 102 are coupled to each other to form CMOS device 100, here a logic inverter.

Particularly, PMOS transistor 101 has source terminal 103 and body or substrate ("back-gate") terminal 104 coupled to positive voltage rail ($V_{dd}$) 105. Input ($V_i$) 108 of device 100 is coupled to gate terminal 106 of PMOS transistor 101 and to gate terminal 107 of NMOS transistor 102. Output ($V_o$) 111 of inverter 100 is coupled to drain terminal 109 of PMOS transistor 101 and to drain terminal 110 of NMOS transistor 102. Source 112 and body terminal 113 of NMOS transistor 102 are coupled to low voltage rail ($V_{ss}$) 114 (e.g., ground or 0 V).

As mentioned above, CMOS device 100 of FIG. 1 does not include a mechanism for body-biasing. In contrast, CMOS device 120 of FIG. 2 has conventional body-biasing applied thereto. Specifically, in CMOS device 120, PMOS transistor 101 has its body terminal 104 coupled to PMOS biasing voltage source 115, and NMOS transistor 102 has its body terminal 113 coupled to NMOS biasing voltage source 116.

In a typical implementation, CMOS device 120 may use sensing and control circuits deployed in the IC to compensate for PVT variations by applying reverse or forward body-biasing voltages 115 and 116 to body terminals 104 and 113, respectively, as a function of process and operating temperature conditions. Sensors may comprise process, temperature, and performance sensors distributed across the IC. The sensed data is translated into a voltage value that a biasing voltage source then applies to the body terminal of a corresponding transistor. The performance of a transistor biased in this way can be tuned by adapting the output voltage of its biasing voltage source.

Figure 3:
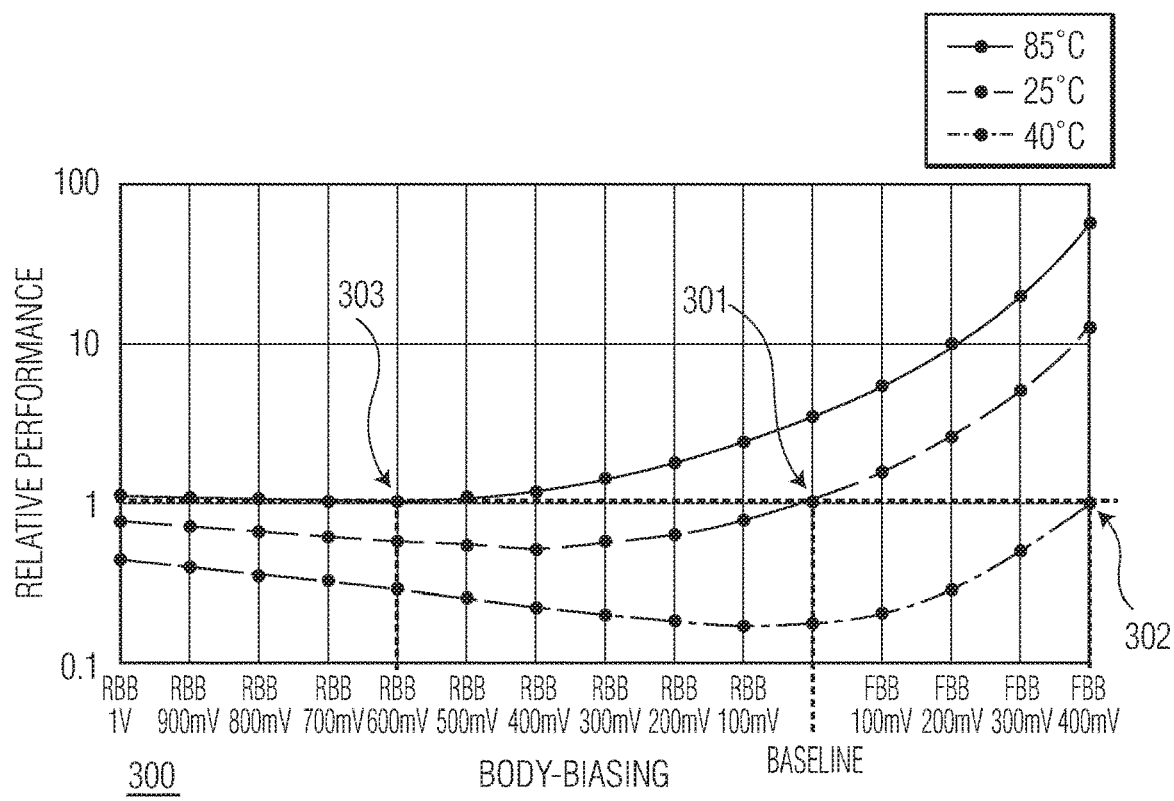
FIG. 3 is a graph illustrating relative performance versus body-biasing voltages in a conventional CMOS device.

FIG. 3 is a graph illustrating relative performance versus body-biasing voltages in a conventional CMOS device, such as CMOS inverter 120 of FIG. 2. In graph 300, the vertical axis represents the device's relative performance, and the horizontal axis an amount of body-biasing voltage applied to the substrate (or back-gate) of the device. Graph 300 shows three performance vs. body-biasing curves, each curve for three different operating temperatures: −40° C. (slow condition), 25° C. (normal condition), and 85° C. (fast condition).

In operation, a PVT control algorithm works as follows. In slow conditions (e.g., low temperature and/or slow process), transistors can be speeded up by applying forward-biasing. In these cases, transistors are inherently less leaky, as they present a higher threshold voltage $V_t$ and less electron mobility. Therefore, any leakage increase due to forward biasing has only a minimal effect on the overall energy budget.

In the context of FIG. 3, a slow condition can happen when operating conditions shift from the middle temperature curve (25° C.), at baseline point 301, to the low temperature curve (−40° C.). In order to recover performance, forward body-biasing (FFB) can be applied—in this case, approximately 400 mV of forward body-biasing-to maintain relative performance at "1"—now at point 302.

In fast conditions (e.g., high temperature and/or fast process), transistors are leakier and can be made less leaky by applying reverse-biasing. In these cases, transistors are inherently fast, as they present a lower $V_T$ and higher electron mobility). Therefore, speed degradation due to reverse biasing has minimal effect on the overall energy budget.

Again in the context of FIG. 3, a fast condition can happen when operating conditions shift from the from the middle temperature curve (25° C.), again at baseline point 301, to the elevated temperature (85° C.). In order to recover performance, reverse body-biasing (RRB) can be applied—in this case, approximately 600 mV of reverse body-biasing—to maintain relative performance at "1"—now at point 303.

In sum, reverse and forward biasing can be applied by generating the appropriate voltage potential on the back-gate of a transistor with respect to the source of that transistor. As illustrated in FIG. 2, however, the conventional practice is to generate the voltage potential using voltage sources 115 and/or 116.

In contrast with the foregoing, systems and methods described herein provide self-regulating body-bias voltage circuitry configured to compensate for PVT fluctuations in sub-threshold technologies, and particularly in FDSOI technology. It is noted that application of the same techniques to conventional CMOS transistors can lead to undesirable latch-up conditions. As the inventors hereof have recognized, however, FDSOI transistors are much more immune to latch-up because of the additional Galvanic isolation provided by a buried oxide layer. Moreover, Application of these techniques does not require additional sensors, or translation of sensor data into transistor characteristics.

Figure 4:
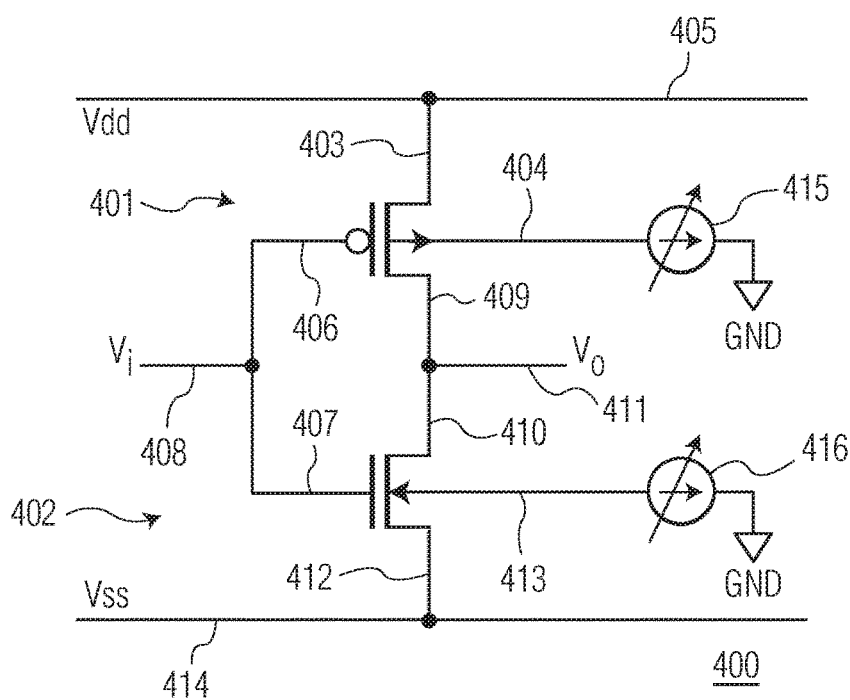
FIG. 4 is a diagram of an example of a Fully-Depleted Silicon-on-Insulator (FDSOI) device with current sources controlling the application of body-biasing, according to some embodiments.

FIG. 4 is a diagram of an example of an FDSOI device with current sources controlling the application of body-biasing, according to some embodiments. Particularly, PMOS transistor 401 and NMOS transistor 402 are coupled to each other to form FDSOI device 400 (e.g., another logic inverter). Particularly, PMOS transistor 401 has source terminal 403 coupled to $V_{dd}$ 405. Input ($V_i$) 408 of device 400 is coupled to gate terminal 406 of PMOS transistor 401 and to gate terminal 407 of NMOS transistor 402. Output ($V_o$) 411 of inverter 400 is coupled to drain terminal 409 of PMOS transistor 401 and to drain terminal 410 of NMOS transistor 402. Also, source terminal 412 of NMOS transistor 402 is coupled to $V_{ss}$ 414.

In contrast with CMOS device 120 of FIG. 2, in FDSOI device 400, PMOS transistor 401 has its body terminal 404 coupled to PMOS biasing current source 415, and NMOS transistor 402 has its body terminal 413 coupled to NMOS biasing current source 416.

Conventional back-biasing design practices (e.g., in FIG. 2) have ignored the impact of current loading on the back-gate of the transistor due to different conditions. As the inventors hereof have determined, however, in slow conditions, the current going into the back-gate is reduced at a constant back-gate voltage. Conversely, in fast conditions, the current going into the back-gate is increased at the constant back-gate voltage.

Figure 5:
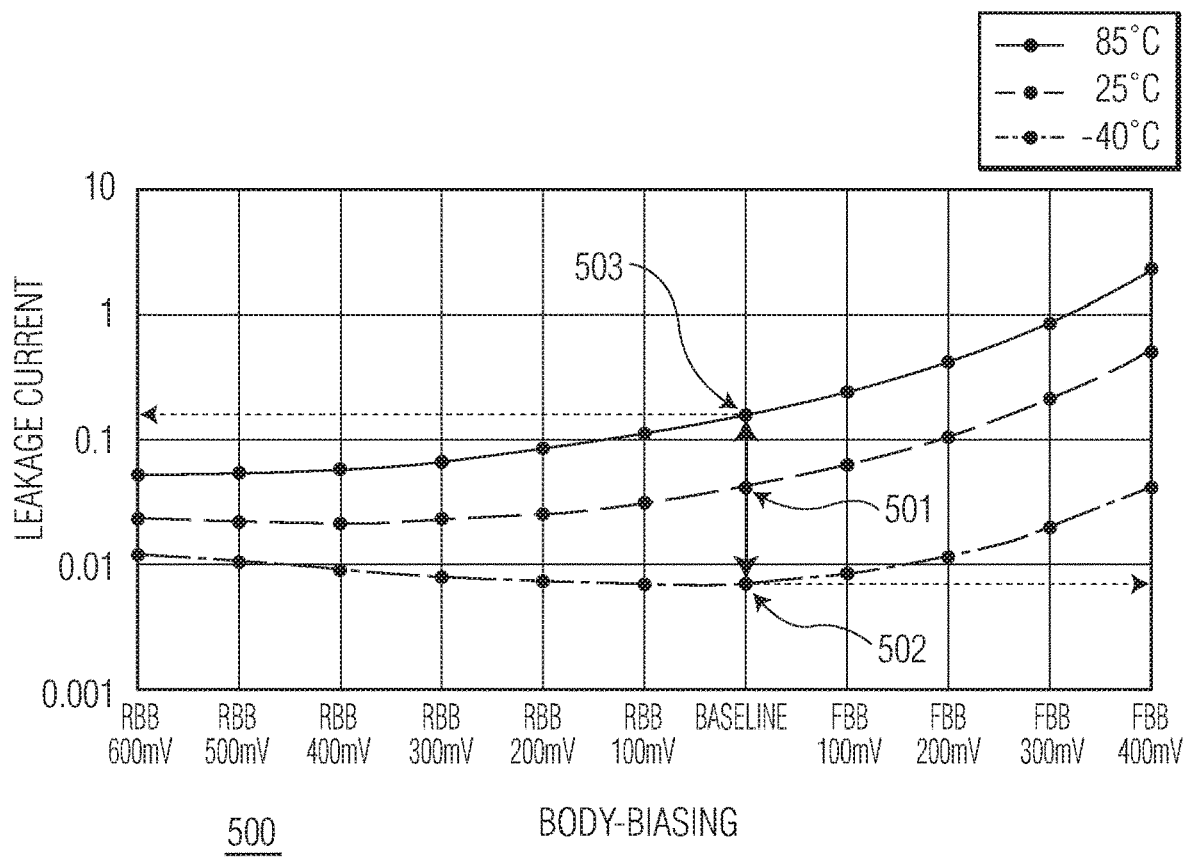
FIG. 5 is a graph illustrating leakage current versus body-biasing, in the case where current sources control FDSOI substrate biasing, according to some embodiments.

When a high-impedance current is applied to the back-gates of transistors 401 and 402, FDSOI circuit 400 of FIG. 4 operates as follows: in slow conditions, the back-gates of transistors 401 and 402 are fed more current than needed for maintenance of a constant voltage (at the back-gates) by current sources 415 and 416, respectively. The voltages are adjusted on each node to allow sinking the additional currents, respectively, and therefore the transistors become automatically forward-biased. In fast conditions, the back-gates of transistors 401 and 402 are fed less current than needed for maintenance of constant voltage (at the back-gates). Therefore, the voltages are adjusted on each node to allow the conditions for the reduced currents, respectively, and therefore the transistors become automatically reverse-biased FIG. 5 is a graph illustrating leakage current versus body-biasing, in the case where current sources control FDSOI substrate biasing, according to some embodiments. The effect of slow conditions is illustrated by moving from baseline point 501 at a nominal temperature (25° C.) to a lower operating temperature curve (−40° C.), where the current needed has decreased and the back-gate of the transistor is fed more current than desired at point 502. Conversely, the effect of fast conditions is illustrated by moving from baseline point 501 at a nominal temperature (25° C.) to a higher operating temperature curve (85° C.), where the current needed has increased and the back-gate of the transistor is fed less current than needed at point 503. This means that the automatic voltage adjustment at the back-gate adapts itself according to the PVT conditions that the transistor is exposed to.

In various implementations, a high-impedance current-based driver may be used to apply a biasing-voltage to the back-gate (or body terminal) of an FDSOI transistor-by feeding a constant, fixed, or selected electrical current to the body terminal of the transistor. Such a high-impedance current source(s) continuously tries to adjust the voltage on the bulk of a transistor automatically, to keep its output current at a stable value, within suitable tolerance thresholds, therefore auto-regulating the body-biasing applied to a design and hence compensating for PVT variations.

Figure 6:
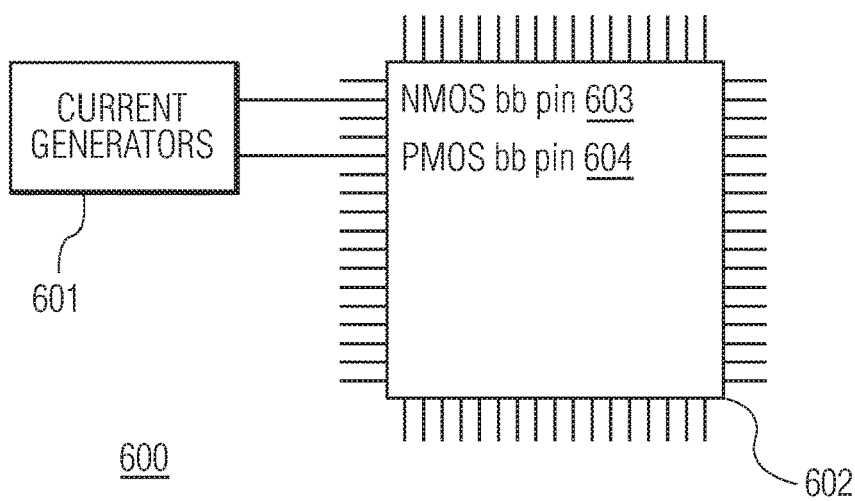
FIG. 6 is a diagram of an example of an FDSOI Integrated Circuit (IC) with body-biasing current sources disposed outside the IC, according to some embodiments.

FIG. 6 is a diagram of an example of an FDSOI IC with body-biasing current source circuitry 601 disposed outside of IC 602, according to some embodiments. In this case, a first high-impedance current generator or source (e.g., 416) in circuitry 601 is coupled to NMOS body-biasing pin 603, and a second high-impedance current generator or source (e.g., 415) in circuitry 601 is coupled to PMOS body-biasing pin 604. IC 602 may include internal rails configured to apply selected currents provided by body-biasing current source circuitry 601 to all transistors of interest within IC 602.

In other implementations, body-biasing current sources may be placed inside the IC and may provide controlled body-bias currents to different power domains. If these currents are generated internally, depending on the PMOS or NMOS gate, the voltage supply for the current generator may be either higher or lower than conventional FDSOI supplies, respectively.

Figure 7:
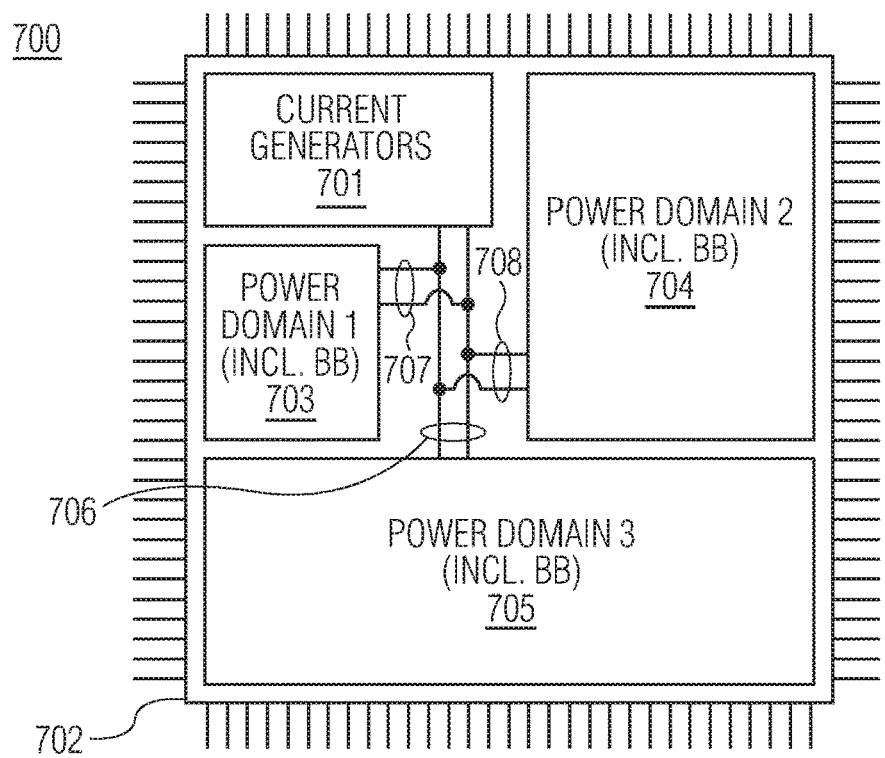
FIG. 7 is a diagram of an example of an FDSOI IC with body-biasing current sources disposed within the IC and coupled to a current bus shared across different power domains, according to some embodiments.
Figure 8:
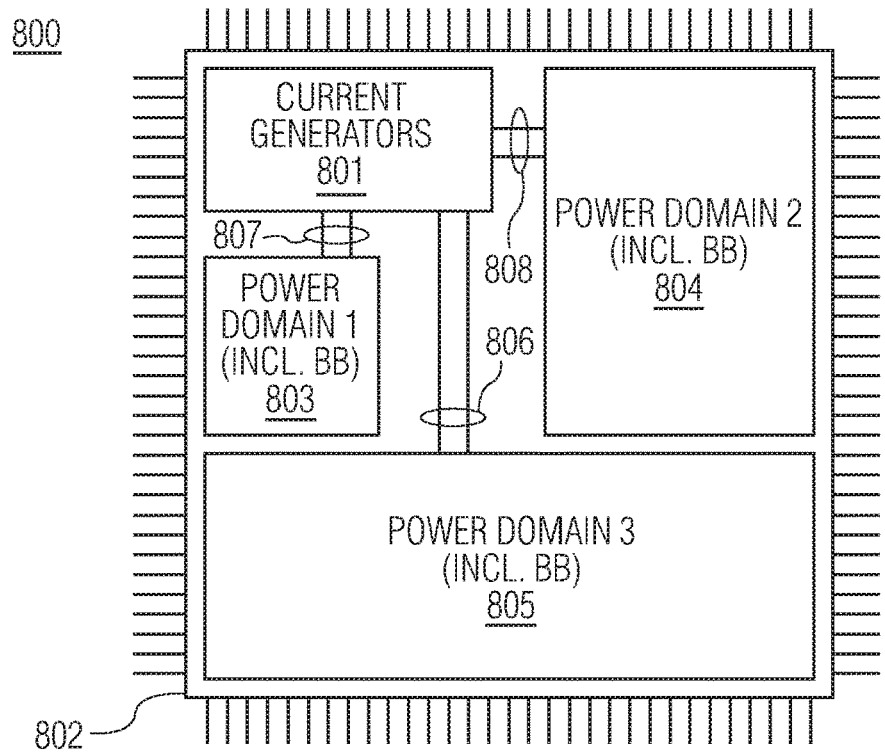
FIG. 8 is a diagram of an example of an FDSOI IC with body-biasing current sources disposed within the IC and coupled to each different power domain individually, according to some embodiments.

FIG. 7 is a diagram of FDSOI IC 700 with body-biasing current sources 701 coupled to a single current bus with rails 706-708 shared across different power domains 703-705. In this example, body-biasing current sources 701 supply the same electrical currents (a first current for NMOS devices and a second current for PMOS devices) to all power domains that have body-biasing enabled. Meanwhile, FIG. 8 is a diagram of FDSOI IC 800 with body-biasing current sources 801 coupled to each different power domain 803-805 through rails 807, 808, and 806, individually, each bus having a first rail for a first current (for NMOS devices) and a second rail current for a second current (for PMOS devices).

Figure 9:
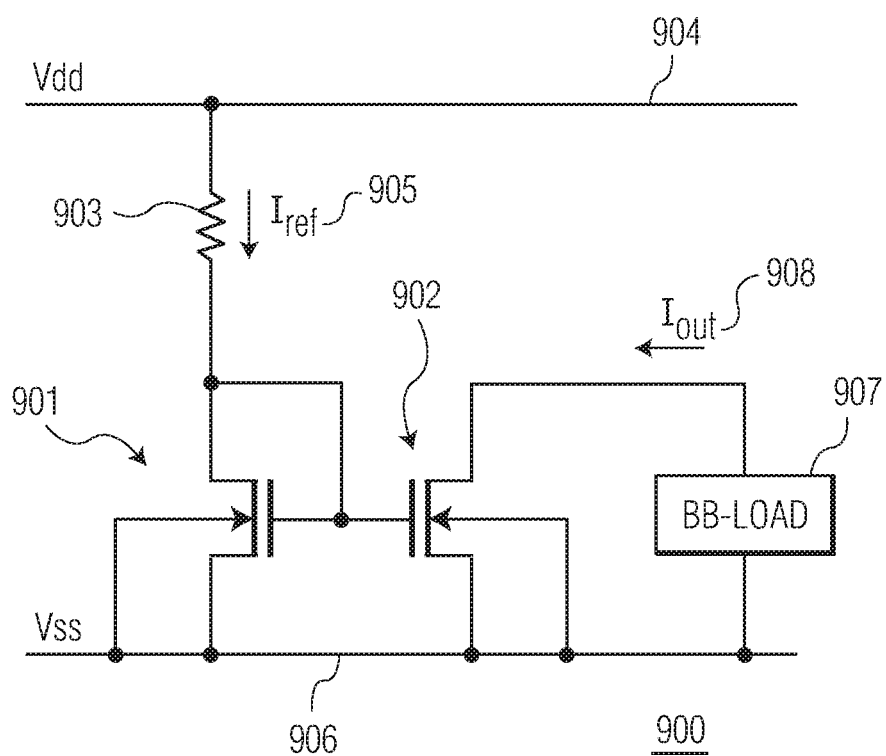
FIG. 9 is a diagram of an example of a current source coupled to a body-biasing load, according to some embodiments.

Many options are available for implementing high-impedance current sources 414 and 415, including but not limited to: a current mirror, an op-amp-controlled current source, a current source based on a Zener diode, etc. FIG. 9 is a diagram of an example of current source 900 coupled to body-biasing load 907. In this case, NMOS transistors 901 and 902 are coupled to each other in a mirror configuration between voltage rails 904 and 906, with resistor 903 setting a reference current $I_{ref}$ 905, and with body-biasing load 907 drawing current $I_{out}$ 908 from the current mirror. Body biasing load 907 may be any power domain inside an IC.

In other implementations, instead of using a high-impedance current source with a fixed output, a variable output can be used. This gives the user the opportunity to select the amount of current and therefore the amount of PVT compensation provided with the same circuitry.

As described above, in various embodiments, techniques described herein enable controlling the bulk of FDSOI transistors (and hence body-biasing) by a current source, therefore automatically compensating for PVT fluctuations without the need of a dedicated monitor or sensor. In contrast with conventional body bias schemes discussed previously, the present techniques described herein produce very little heating and hence small temperature fluctuations. These techniques may be applied to all FDSOI designs that benefit from body-biasing, including, but not limited to, microprocessors, microcontrollers, Graphics Processing Units (GPUs), Digital Signal Processors (DSPs), memories, etc. With future envisioned IoT products, cost (i.e., die area) and power consumption can be significantly reduced.

In an illustrative, non-limiting embodiment, an electronic device may include a logic cell having a plurality of FDSOI transistors manufactured thereon, and at least one current source coupled to a body terminal of each transistor in a subset of the FDSOI transistors, where the current source is configured to output a high-impedance current. The at least one current source may be configurable to output a selectable high-impedance current.

In response to the logic cell operating at a temperature smaller than a baseline temperature, the high-impedance current may be configured to forward bias each transistor of the subset of FDSOI transistors. Additionally, or alternatively, in response to the logic cell operating at a temperature greater than a baseline temperature, the high-impedance current may be configured to reverse bias each transistor of the subset of FDSOI transistors.

At least a subset of FDSOI transistors may include NMOS transistors and PMOS transistors, and the at least one current source may include: a first current source coupled to the body terminal of each NMOS transistor, and a second current source coupled to the body terminal of each PMOS transistor.

In some cases, the first and second current sources may be disposed outside of an integrated circuit were the logic cell is located, the first current source may be coupled to a first body-biasing rail of the logic cell, and the second current source may be coupled to a second body-biasing rail of the logic cell.

In other cases, the first and second current sources may be disposed within an integrated circuit were the logic cell is located, the logic cell includes two or more power domains, the first current source provides a first high-impedance current to the two or more power domains, and the second current source provides a second high-impedance current to the two or more power domains.

In yet other cases, the first and second current sources may be disposed within an integrated circuit were the logic cell is located, the logic cell includes two or more power domains, the first current source provides a first high-impedance current to a first power domain and a second high-impedance current to a second power domain, and the second current source provides a third high-impedance current to the first power domain and a fourth high-impedance current to the second power domain.

In another illustrative, non-limiting embodiment, an integrated circuit may include an FDSOI NMOS transistor having a first gate terminal, a first drain terminal, a first source terminal coupled to a first voltage rail, and a first body terminal coupled to a first current source, and an FDSOI PMOS transistor having a second gate terminal coupled to the first gate terminal, a second drain terminal coupled to the first drain terminal, a second source terminal coupled to a second voltage rail, and a second body terminal coupled to a second current source.

The first current source may be configured to, in response to the integrated circuit operating at a temperature smaller than a baseline temperature: output a first selected current configured to forward bias the FDSOI NMOS transistor; and output a second selected current configured to forward bias the FDSOI PMOS transistor.

The first current source may also be configured to, in response to the integrated circuit operating at a temperature greater than a baseline temperature: output a third selected current configured to reverse bias the FDSOI NMOS transistor; and output a fourth selected current configured to reverse bias the FDSOI PMOS transistor.

The first and second current sources may be configurable to output selectable high-impedance currents. In some cases, the first and second current sources may be disposed outside of the integrated circuit, where the first current source is coupled to a first body-biasing terminal of the integrated circuit, and where the second current source is coupled to a second body-biasing terminal of the integrated circuit. In other cases, the first and second current sources may be disposed within the integrated circuit, where the integrated circuit further comprises two or more power domains, where the first current source provides a first selected current to the two or more power domains, and where the second current source provides a second selected current to the two or more power domains. In yet other cases, the first and second current sources may be disposed within the integrated circuit, where the integrated circuit further comprises two or more power domains, where the first current source provides a first selected current to a first power domain and a second selected current to a second power domain, and where the second current source provides a third selected current to the first power domain and a fourth selected current to the second power domain.

In yet another illustrative, non-limiting embodiment, in a device having a plurality of FDSOI NMOS and PMOS transistors, a method may include generating a first fixed current configured to body bias the FDSOI NMOS transistors to reduce PVT fluctuations, and generating a second fixed current configured to body bias the FDSOI PMOS transistors to reduce the PVT fluctuations.

In response to the device operating at a temperature smaller than a baseline temperature, the first fixed current may be configured to forward bias the FDSOI NMOS transistors; and in response to the device operating at a temperature greater than the baseline temperature, the first fixed current may be configured to reverse bias the FDSOI NMOS transistors. Additionally, or alternatively, in response to the device operating at a temperature smaller than a baseline temperature, the second fixed current may be configured to forward bias the FDSOI PMOS transistors; and in response to the device operating at a temperature greater than the baseline temperature, the second fixed current may be configured to reverse bias the FDSOI PMOS transistors.

In some cases, the first and second current sources may be disposed outside of an integrated circuit were the FDSOI NMOS and PMOS transistors are located, where the first current source is coupled to a first body-biasing terminal of the device, and where the second current source is coupled to a second body-biasing terminal of the device. In other case, the first and second current sources may be disposed on the device were the FDSOI NMOS and PMOS transistors are located, where the device comprises two or more power domains, where the first current source provides the first fixed current to at least a first one of the two or more power domains, and where the second current source provides a second fixed current to at least the first power domain.

In many implementations, the systems and methods disclosed herein may be incorporated into a wide range of electronic devices including, for example, computer systems or Information Technology (IT) products such as servers, desktops, laptops, memories, switches, routers, etc.; telecommunications hardware; consumer devices or appliances such as mobile phones, tablets, television sets, cameras, sound systems, etc.; scientific instrumentation; industrial robotics; medical or laboratory electronics such as imaging, diagnostic, or therapeutic equipment, etc.; transportation vehicles such as automobiles, buses, trucks, trains, watercraft, aircraft, etc.; military equipment, etc. More generally, these systems and methods may be incorporated into any device or system having one or more electronic parts or components.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An electronic device, comprising:
    a logic cell having a plurality of Fully-Depleted Silicon-on-Insulator (FDSOI) transistors manufactured thereon; and
    at least one constant current source coupled to a body terminal of each transistor in a subset of the FDSOI transistors, wherein the constant current source is configured to output a high-impedance current.

2. The electronic device of claim 1, wherein in response to the logic cell operating at a temperature smaller than a baseline temperature, the high-impedance current is configured to forward bias each transistor of the subset of FDSOI transistors.

3. The electronic device of claim 2, wherein in response to the logic cell operating at a temperature greater than a baseline temperature, the high-impedance current is configured to reverse bias each transistor of the subset of FDSOI transistors.

4. The electronic device of claim 3, wherein the subset of FDSOI transistors comprises N-type Metal-Oxide-Semiconductor Field-Effect (NMOS) transistors and P-type Metal-Oxide-Semiconductor Field-Effect (PMOS) transistors, and wherein the at least one constant current source further comprises:
    a first constant current source coupled to the body terminal of each NMOS transistor; and
    a second constant current source coupled to the body terminal of each PMOS transistor.

5. The electronic device of claim 4, wherein the first and second constant current sources are disposed outside of an integrated circuit were the logic cell is located, wherein the first constant current source is coupled to a first body-biasing rail of the logic cell, and wherein the second constant current source is coupled to a second body-biasing rail of the logic cell.

6. The electronic device of claim 4, wherein the first and second constant current sources are disposed within an integrated circuit were the logic cell is located, wherein the logic cell comprises two or more power domains, wherein the first constant current source provides a first high-impedance current to the two or more power domains, and wherein the second constant current source provides a second high-impedance current to the two or more power domains.

7. The electronic device of claim 4, wherein the first and second constant current sources are disposed within an integrated circuit were the logic cell is located, wherein the logic cell comprises two or more power domains, wherein the first constant current source provides a first high-impedance current to a first power domain and a second high-impedance current to a second power domain, and wherein the second constant current source provides a third high-impedance current to the first power domain and a fourth high-impedance current to the second power domain.

8. The electronic device of claim 4, wherein the at least one constant current source is configurable to output a selectable high-impedance current.

9. An integrated circuit, comprising:
   a Fully-Depleted Silicon-on-Insulator (FDSOI) N-type Metal-Oxide-Semiconductor Field-Effect (NMOS) transistor having a first gate terminal, a first drain terminal, a first source terminal coupled to a first voltage rail, and a first body terminal coupled to a first fixed current source; and
   an FDSOI P-type Metal-Oxide-Semiconductor Field-Effect (PMOS) transistor having a second gate terminal coupled to the first gate terminal, a second drain terminal coupled to the first drain terminal, a second source terminal coupled to a second voltage rail, and a second body terminal coupled to a second fixed current source.

10. The integrated circuit of claim 9, wherein the first fixed current source is configured to, in response to the integrated circuit operating at a temperature smaller than a baseline temperature,
   output a first selected current configured to forward bias the FDSOI NMOS transistor; and
   output a second selected current configured to forward bias the FDSOI PMOS transistor.

11. The integrated circuit of claim 10, wherein the first fixed current source is configured to, in response to the integrated circuit operating at a temperature greater than a baseline temperature,
   output a third selected current configured to reverse bias the FDSOI NMOS transistor; and
   output a fourth selected current configured to reverse bias the FDSOI PMOS transistor.

12. The integrated circuit of claim 9, wherein the first and second fixed current sources are configurable to output selectable high-impedance currents.

13. The integrated circuit of claim 9, wherein the first and second fixed current sources are disposed outside of the integrated circuit, wherein the first fixed current source is coupled to a first body-biasing terminal of the integrated circuit, and wherein the second fixed current source is coupled to a second body-biasing terminal of the integrated circuit.

14. The integrated circuit of claim 9, wherein the first and second fixed current sources are disposed within the integrated circuit, wherein the integrated circuit further comprises two or more power domains, wherein the first fixed current source provides a first selected current to the two or more power domains, and wherein the second fixed current source provides a second selected current to the two or more power domains.

15. The integrated circuit of claim 9, wherein the first and second fixed current sources are disposed within the integrated circuit, wherein the integrated circuit further comprises two or more power domains, wherein the first fixed current source provides a first selected current to a first power domain and a second selected current to a second power domain, and wherein the second fixed current source provides a third selected current to the first power domain and a fourth selected current to the second power domain.

16. A method, comprising:
   in a device having a plurality of Fully-Depleted Silicon-on-Insulator (FDSOI) N-type Metal-Oxide-Semiconductor Field-Effect (NMOS) and P-type Metal-Oxide-Semiconductor Field-Effect (PMOS) transistors,
      (i) generating a first selected current configured to body bias the FDSOI NMOS transistors to reduce Process, Voltage, and Temperature (PVT) fluctuations; and
      (ii) generating a second selected current configured to body bias the FDSOI PMOS transistors to reduce the PVT fluctuations.

17. The method of claim 16, wherein:
   in response to the device operating at a temperature smaller than a baseline temperature, the first selected current is configured to forward bias the FDSOI NMOS transistors; and
   in response to the device operating at a temperature greater than the baseline temperature, the selected current is configured to reverse bias the FDSOI NMOS transistors.

18. The method of claim 16, wherein:
   in response to the device operating at a temperature smaller than a baseline temperature, the second selected current is configured to forward bias the FDSOI PMOS transistors; and
   in response to the device operating at a temperature greater than the baseline temperature, the second selected current is configured to reverse bias the FDSOI PMOS transistors.

19. The method of claim 16, wherein the first and second current sources are disposed outside of an integrated circuit were the FDSOI NMOS and PMOS transistors are located, wherein the first current source is coupled to a first body-biasing terminal of the device, and wherein the second current source is coupled to a second body-biasing terminal of the device.

20. The method of claim 16, wherein the first and second current sources are disposed on the device were the FDSOI NMOS and PMOS transistors are located, wherein the device comprises two or more power domains, wherein the first current source provides the first selected current to at least a first one of the two or more power domains, and wherein the second current source provides the second selected current to at least the first power domain.

* * * * *